United States Patent [19]

Baliga

[11] Patent Number: 5,099,300
[45] Date of Patent: Mar. 24, 1992

[54] GATED BASE CONTROLLED THYRISTOR

[75] Inventor: B. Jayant Baliga, Raleigh, N.C.

[73] Assignee: North Carolina State University, Raleigh, N.C.

[21] Appl. No.: 538,252

[22] Filed: Jun. 14, 1990

[51] Int. Cl.⁵ .................... H01L 29/00; H01L 29/74; H01L 29/747; H01L 27/02
[52] U.S. Cl. ........................ 357/37; 357/38; 357/39; 357/43; 357/23.4
[58] Field of Search .......... 357/37, 38, 39, 43, 357/23.4

[56] References Cited

U.S. PATENT DOCUMENTS 4,935,799  6/1990  Mori et al. ............... 357/43
4,963,972 10/1990  Shinohe et al. .......... 357/38

Primary Examiner—Rolf Hille
Assistant Examiner—Wael Fahmy
Attorney, Agent, or Firm—James B. Hinson

[57] ABSTRACT

A switching device including four layers (20), (22), (42) and (44) and a gate electrode (32). In its blocking state the switching device operates as a conventional thyristor. The device is turned off by reducing the effective resistance of the upper base region (42) by applying a negative voltage to the gate (32).

3 Claims, 6 Drawing Sheets

GATED BASE CONTROLLED THYRISTOR

BACKGROUND OF THE INVENTION

1. Description of the prior art

There is a great deal of interest in the development of bipolar switching semiconductor devices. Prior art structures include the IGBT, MCT, and the DMT. In typical switching devices it is preferable to conduct the on state current via a thyristor structure because this mode of operation results in lower forward voltage drop and reduced power dissipation. MOS gated control turn-off is desirable because the high input impedance simplifies the drive circuit and reduces cost. These features are achieved in the MCT by using a MOSFET within the base region of the thyristor to create a substantially short circuit between the emitter and base of the thyristor. In the case of the DMT a depletion mode MOSFET is used to pinch off the base current within the thyristor to achieve turn off.

2. Summary of the invention

The switching device which is the subject of this invention can be conveniently considered as a typical thyristor in combination with a MOSFET device used to decrease the base resistance and the base current when the thyristor is in the on-state. Reducing the base current increases the holding current. Since the holding current of the thyristor is inversely proportional to the base resistance, raising the holding current to above the operating current by reducing the effective resistance of the base region, results in turn off of the thyristor. Although this can be done in several ways the preferred method is to use a MOS gate structure as disclosed in this Patent Application.

DEFINITION: For purposes of this patent application the term "effective base resistance of the base region" means the electrical resistance between the upper base region and the cathode electrode along all paths by-passing the PN junction between the upper base region and the cathode region.

More specifically, the preferred embodiment of the invention comprises a four layer semiconductor switching device which includes: a semiconductor structure comprising an anode region, a lower base region, an upper base region, a cathode region, and a diverter region; an anode electrode affixed to the anode region; a cathode electrode affixed to said cathode region; and gate means disposed on and insulated from one surface of the semiconductor structure for modifying the effective resistance of at least one of the base regions thereby diverting current to the diverter region to reduce the internal feedback of the switching device sufficiently to turn off the semiconductor switching device.

DESCRIPTION OF THE DRAWINGS

FIGS. 1A through 6A are cross-section drawings of a typical semiconductor substrate, along a second plane, as the substrate is processed to fabricate the preferred embodiment of the invention.

DETAILED DESCRIPTION

Figure 1:
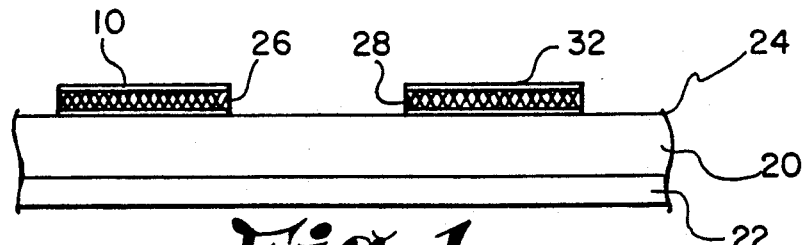
FIGS. 1 through 6 are cross-section drawings of a typical semiconductor substrate, along a first plane, as the substrate is processed to fabricate the preferred embodiment of the invention.
Figure 1A:
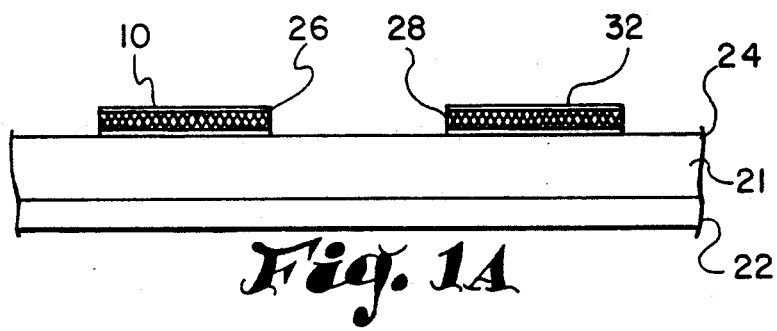

The invention is subsequently described in conjunction with the process for fabricating the preferred embodiment of the invention. FIGS. 1 through 6 and FIGS. 1A through 6A respectively illustrate a typical semiconductor substrate in cross-section along first and second planes as the substrate is processed to fabricate the preferred embodiment of the invention.

More specifically, these Figures illustrated the fabrication of a typical section of the semiconductor device comprising the preferred embodiment of the invention with the illustrated section being duplicated to produce a switching device of the desired current capacity. This is a typical technique for describing and fabricating a high power semiconductor device.

FIGS. 1 through 6 illustrates the switching device in cross-section along a plane passing through the thyristor the central portion (typically the center) of the device. This view corresponds to the front view of FIG. 7. FIGS. 1A through 6A similarly corresponding to the cross-section of the device along view plane A—A' (FIG. 7) passing through the MOSFET portion of the device.

The switching device utilizes a substrate which is preferably of "N" conductivity type having an anode layer 22 of "P" conductivity formed therein and exposed along the bottom surface of the substrate. A first insulating layer, ultimately comprising the gate oxide 24 is formed on the top surface of the substrate. A gate electrode for the MOSFET structure, with first and second portions illustrated at reference numerals 26 and 28, overlies and is affixed to the gate oxide 24. A second layer oxide, with portions illustrated at reference numerals 30 and 32, overlies and is affixed to the polysilicon gate. After fabrication of the gate the upper surface of the substrate is exposed in two regions, one to be used as the cathode emitter 44 of the thyristor and the second to be used as the diverter region (drain of the MOSFET).

Figure 2:
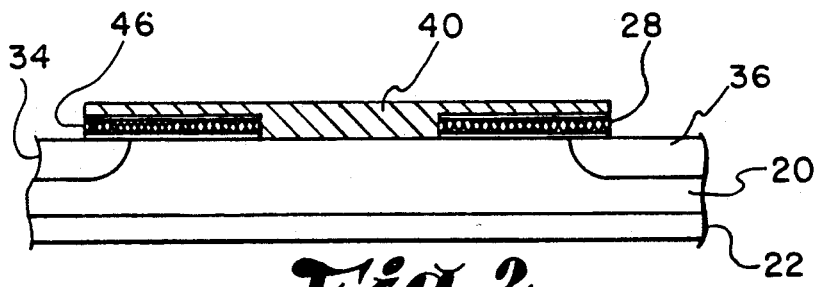
Figure 2A:
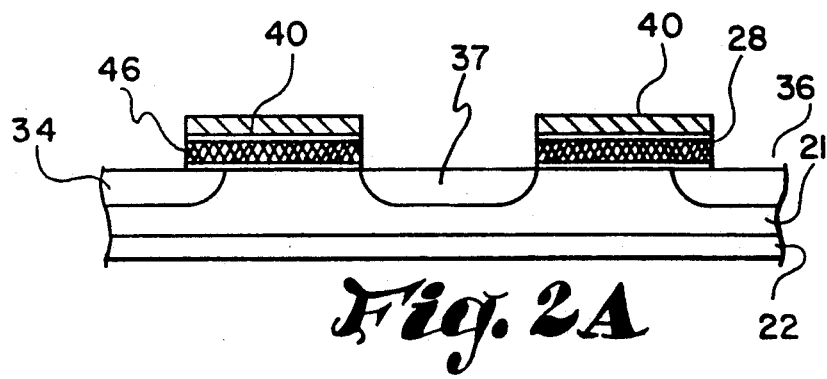
Figure 3:
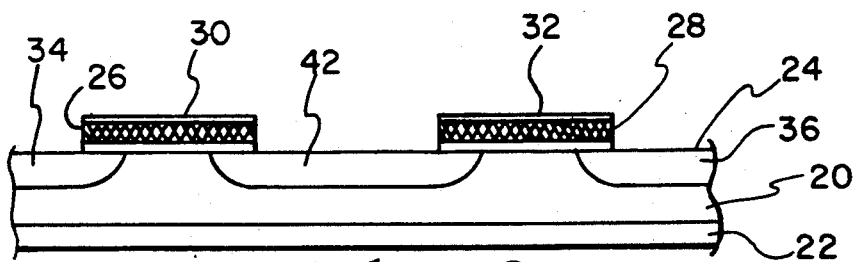
Figure 3A:
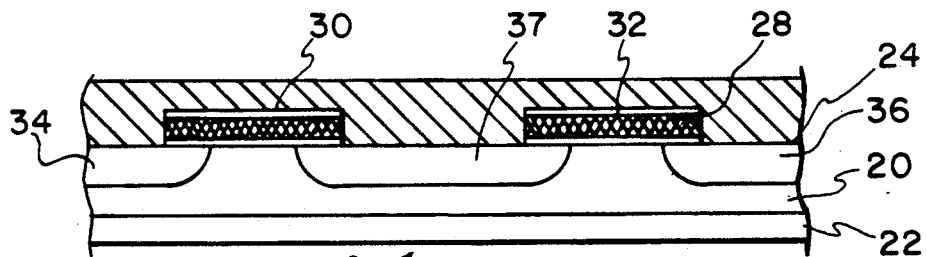

After the substrate has been processed to produce the structure illustrated in FIG. 1, a photoresist layer 40 is formed overlying selected portions of the partially fabricated device and portions of the oxide layer 21 is removed to selectively expose portions of the semiconductor substrate, as illustrated in FIG. 2. Utilizing this photoresist layer as a mask a "P+" diverter region, with typical portions illustrated at reference numerals 34, 36 and 37, is formed in the substrate. Following formation of the diverter region the photoresist layer 40 is removed and the "P" base region 42 is formed, as illustrated in FIG. 3.

Figure 4:
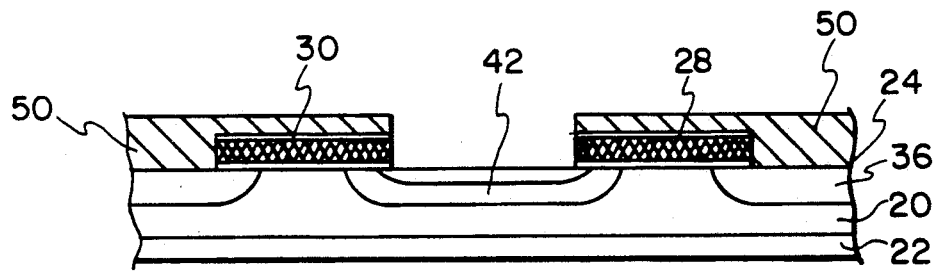
Figure 4A:
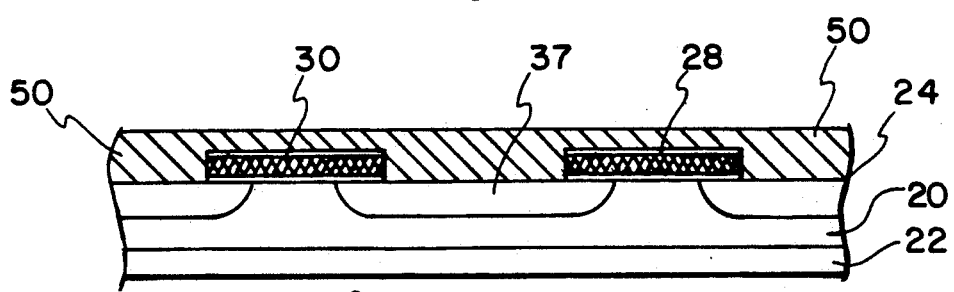
Figure 5:
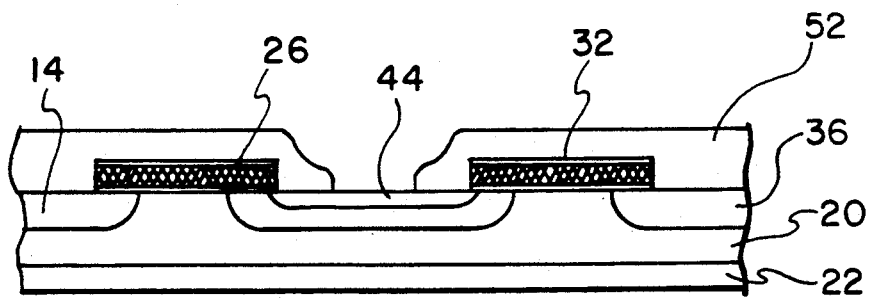
Figure 5A:
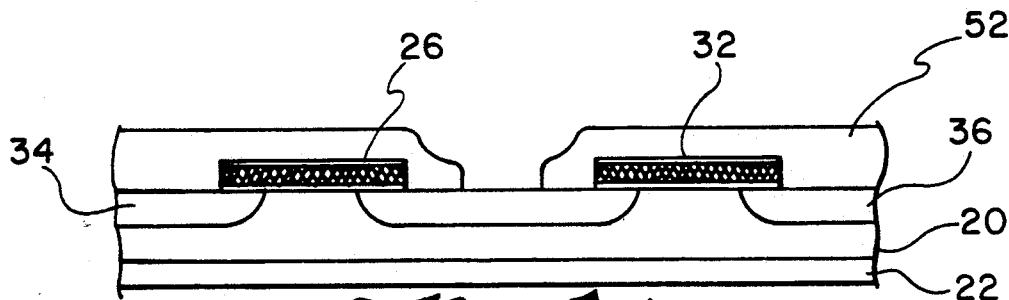
Figure 6:
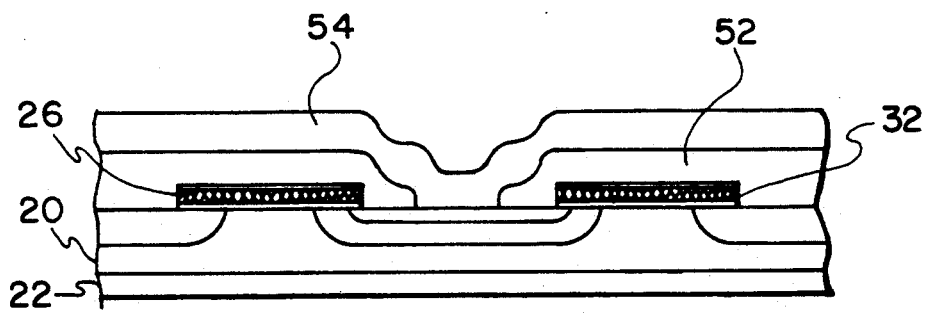
Figure 6A:
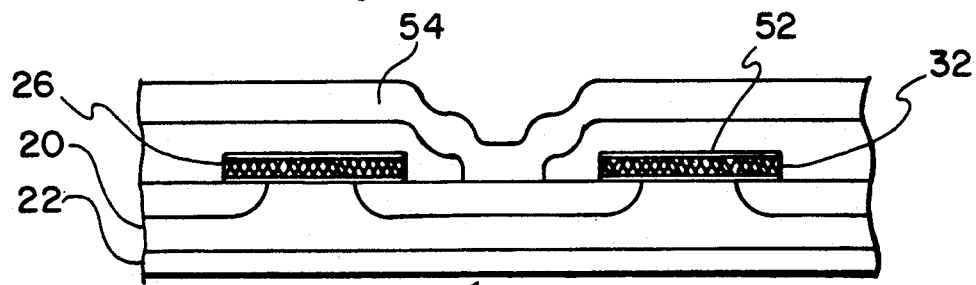
Figure 7:
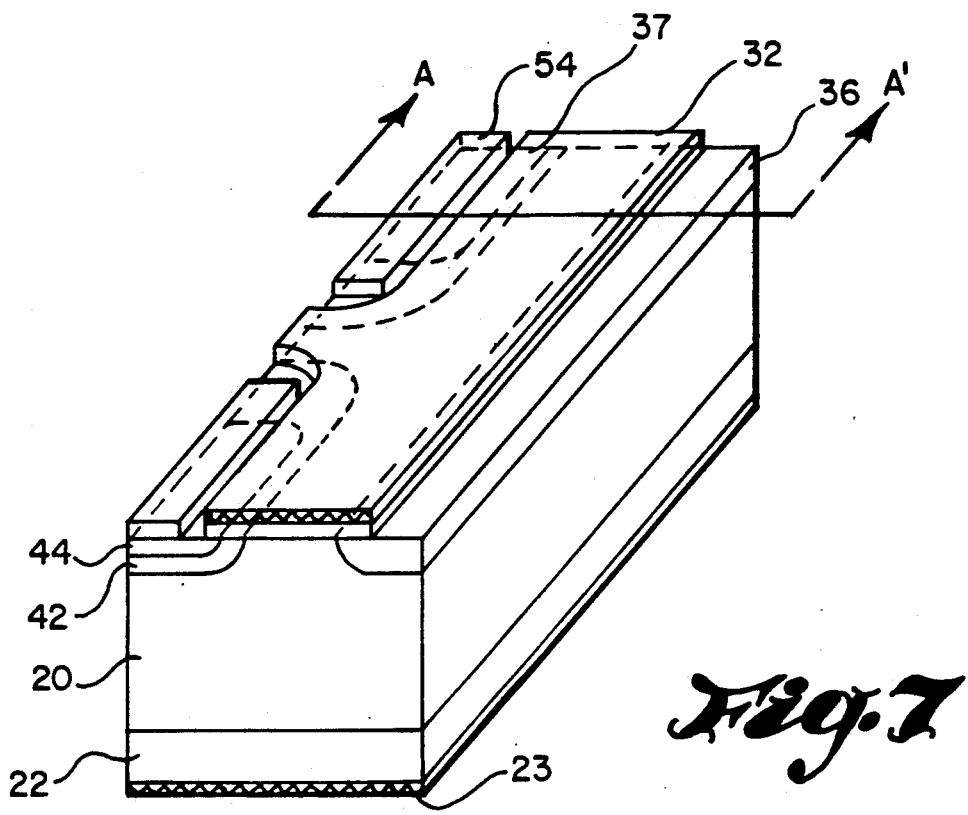
FIG. 7 is a drawing illustrating a portion of a typical section of the switching device comprising the preferred embodiment of the invention.

Another protective layer 50 is formed overlying the upper portions of the substrate and the "N+" cathode emitter region 44 is formed, as illustrated in FIG. 4. Following formation of the "N+" cathode emitter region 44 a insulation layer of silicon dioxide 52 is formed on the upper surface with openings therein to expose the cathode emitter regions 44 and the diverter region, as illustrated in FIG. 5. A metal contact region 54, contacting both the cathode emitter region 44 and the MOSFET source region 37 is formed on and affixed to the upper surface of the device. An anode electrode 23, illustrated in FIG. 7, is affixed to the anode emitter 22. This completes the fabrication of preferred embodiment of the invention, with the typical section discussed above being repeated to form a switching device of the desired current carrying capacity.

FIG. 7 is a more detailed representation of one half of the typical section of the switching device discussed above. The operation of device will described with reference to FIG. 7.

In its off-state the switching device operates as a conventional four layer thyristor with the blocking action occurring at the PN junctions between regions 20 and 22 and between regions 42 and 20. The switching device can be turned on using any of the conventional turn on techniques by supplying sufficient current to the upper base region 42 to forward bias the junction between the upper base region 42 and the upper emitter region 44. The device is turned off by reducing the effective resistance of the upper base region 42 by applying a negative voltage to the gate 32 to form an inversion region along the upper surface of the lower base region 20 causing current to be diverted from the upper base region 42, through the floating diverter region 36 to the source region 37. This reduces the internal positive feedback by decreasing the effective resistance of the upper base region 42 of the thyristor, thereby raising the holding current, and in accordance with well understood principles, turning off the thyristor.

FIG. 7 illustrates (for reasons of simplicity) only one quarter of a typical section of the completed section. If multiple sections are utilized to produce a device having the desired current capacity, the elongated cathode emitter contacts are aligned along their major (longer) axis with a contact to the source of the MOSFET between each of the cathode emitter regions. Additionally, each row begins and terminates with a contact to the source of the MOSFET.

Figure 8:
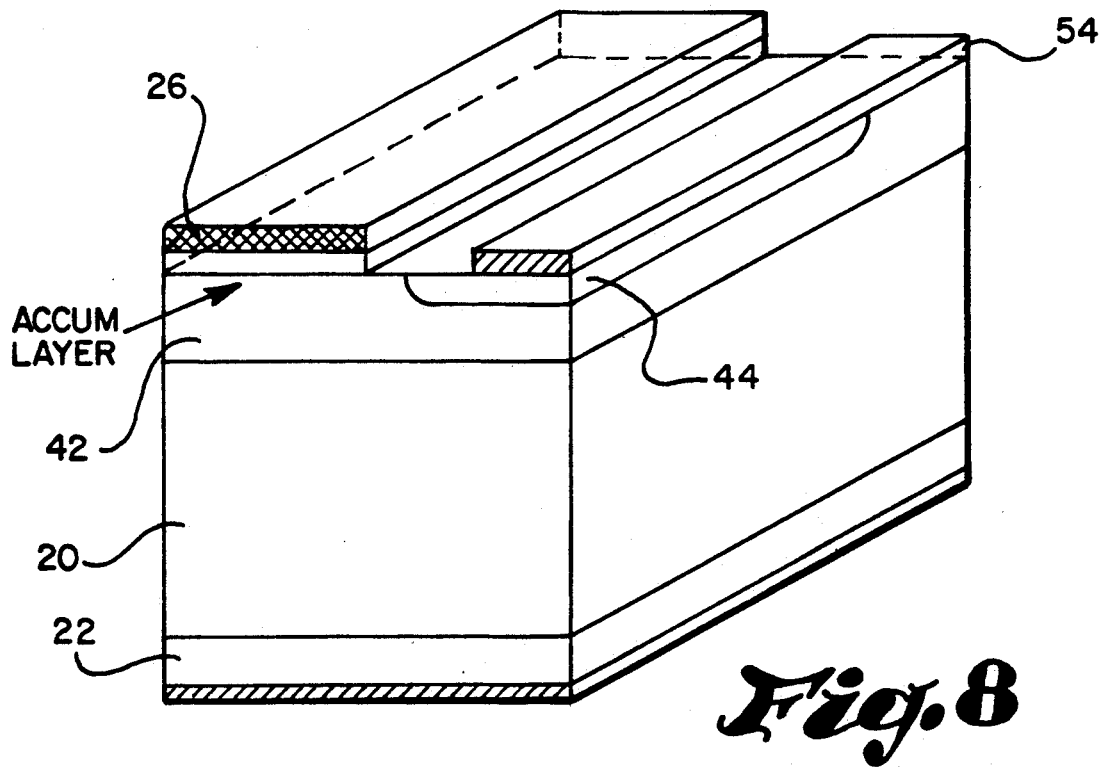
FIG. 8 is a drawing illustrating an alternate embodiment of the invention.
Figure 9:
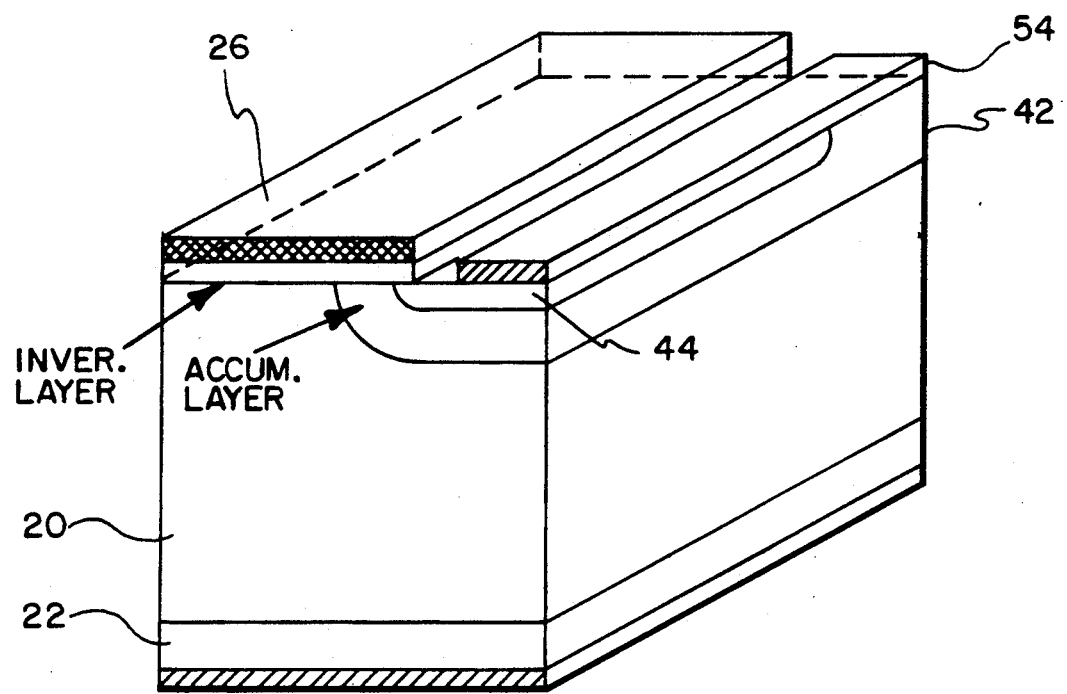
FIG. 9 is a drawing illustrating another alternate embodiment of the invention.
Figure 10:
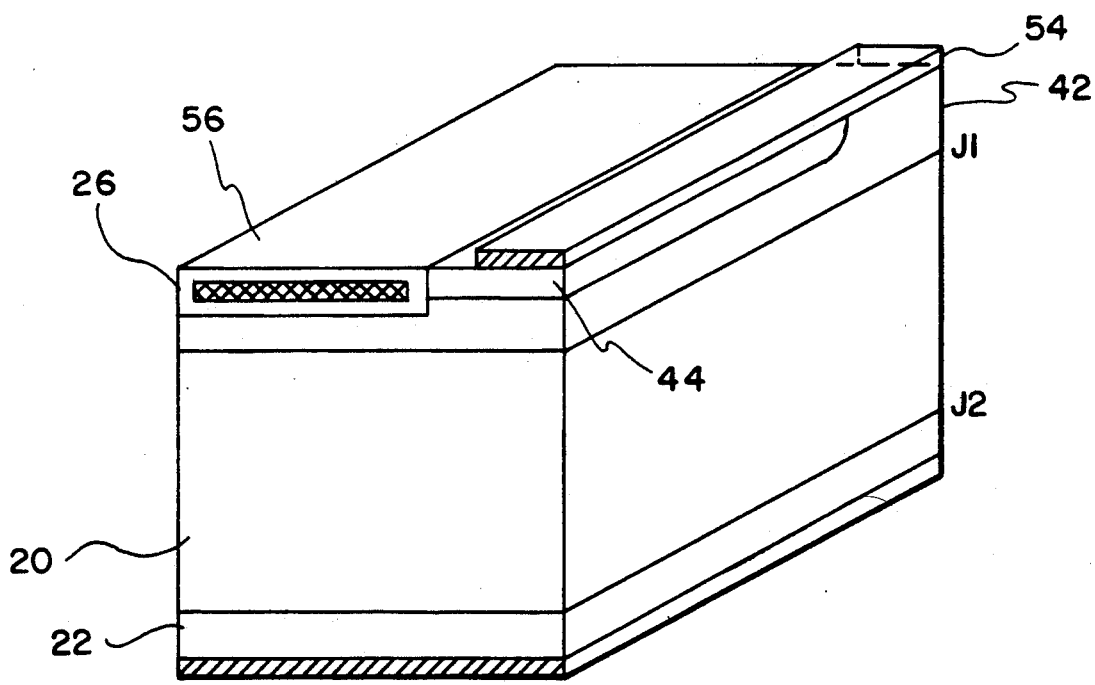
FIG. 10 is a drawing illustrating a third alternate embodiment of the invention.

Alternate embodiments of the invention are illustrated in FIGS. 8 through 10. In these embodiments, the various regions of the thyristors are substantially identical to those previously described and function in a similar fashion. Where appropriate the same reference numbers are used to further illustrate this similarity.

However, in the device illustrated in FIG. 8, the upper surface of the "P" base 42 includes portions which underlie the MOS gate 26. A negative bias applied to the gate 26 creates an accumulation layer which reduces the resistance of the upper portions of the base region 42. As the accumulation layer forms, current is diverted from the upper base-cathode junction. This raises the holding current of the thyristor portion of the device above the on-state current resulting in its turn off. In this case, the accumulation layer serves as the diverter region.

FIG. 9 illustrated another embodiment of the device in which the MOSFET Gate 26 extends over the junction of the upper and lower base regions, 20 and 42, as well as the junction of the upper base region 42 with the cathode emitter region 44. In this embodiment an accumulation layer is formed along the surface of the base region 42 and inversion layer is formed along the upper surface of the lower base region 20 when a negative bias is applied to gate 26. In this case the accumulation and inversion layers serve as the diverter region turning off the thyristor, as previously discussed.

FIG. 10 illustrates another embodiment of the switching device in which the device is turned on using conventional techniques and turned off by applying a negative bias to the MOSFET gate 26. The MOSFET gate 26 is surrounded by an insulation layer 56 to form a substantially flat top surface on which the cathode electrode 54 is formed. This structure operates substantially the same as the first embodiment by diverting current from the upper base region 42 to the diverter region [accumulation layer] previously described.

Figure 11:
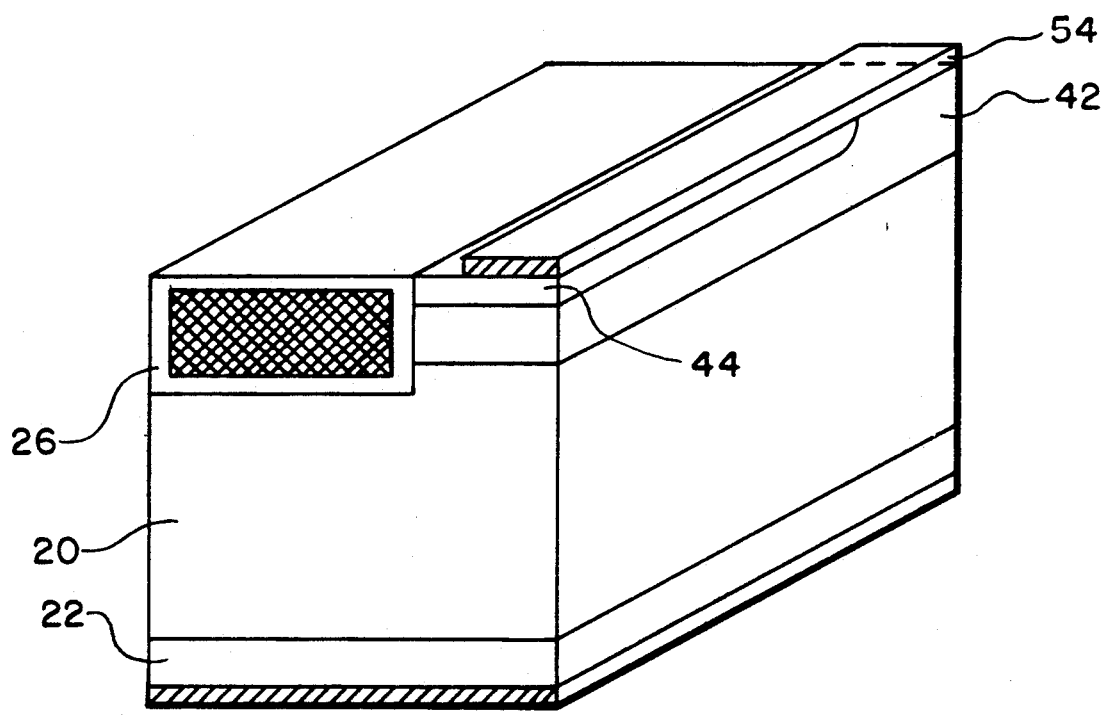
FIG. 11 is a drawing illustrating a fourth alternate embodiment of the invention.

FIG. 11 is still another embodiment of the invention. In this embodiment the recess in which the MOS gate 26 is formed to penetrate through the upper emitter region 44, the upper base region 42 and a selected distance into lower base region 26. This structure operates essentially as preferred embodiment by diverting sufficient current from the upper base region 42 to the diverter region [accumulation and inversion layers] to reduce the internal feedback of the thyristor sufficiently to turn off the device.

In the alternate embodiments illustrated in FIGS. 8 through 11 appropriate "P+" source region (not illustrated) may be included to assure good electrical contact between the electrode 54 and the upper base region 42. However, such source regions are optional.

The various regions of the semiconductor material as well as the insulating and metallic layers needed to form the device can be formed using conventional semiconductor processing techniques. Additionally it should be again emphasized that the invention has been described above with respect to a typical section of the device with the sections repeated as required to produce a device of the desired current carrying capacity.

I claim:

1. A four layer semiconductor switching device comprising in combination:
   a) a semiconductor structure having opposed upper and lower surfaces and including an anode region of a first conductivity type, a lower base region of a second conductivity type, an upper base region of said first conductivity type, a cathode region of said second conductivity type, and a diverter region of said second conductivity type; said anode region extending to said lower surface of said semiconductor structure, said lower base region forming a junction with said anode region with portions extending to said upper surface, said upper base region forming a junction with said lower base region with portions of said upper base region extending to said upper surface of said semiconductor substrate, said cathode region forming a junction with said upper base region and with portions of said anode region also extending to said upper surface of said semiconductor substrate, said diverter forming a junction with said lower base region and extending to said second surface;
   b) a first electrode affixed to said cathode region;
   c) an second electrode affixed to said anode region;
   d) a third electrode affixed to said diverter region;
   e) gate means separated from said upper surface by an electrically insulating layer, said gate means overlying portions of said upper base region which extend to said upper surface and portions of said lower base region which extend to said upper surface, and portions of said diverter region; whereby f) applying a selected potential to said gate forms an electrically conductive path along the upper portions of said lower base region between said upper base region and said third electrode to turn off said thyristor.

2. A four layer semiconductor switching device comprising in combination:
   a) a semiconductor structure including an anode region, a lower base region, an upper base region, a cathode region and a diverter region;
   b) an anode electrode affixed to said anode region;
   c) a cathode electrode affixed to said cathode region;
   d) a MOSFET structure for modifying the effective resistance of at least one of said base regions by diverting current from the junction of said upper base-cathode junction to the source of said MOSFET structure thereby reducing the internal feedback of said switching device sufficiently to turn off said semiconductor switching device; wherein
   e) selected portions of said cathode region form a junction with said upper base region and extend to a common upper surface of said substrate, selected portions of said lower base region forming a junction with said upper base region and extent to said common upper surface, portions of said diverter region forming a junction with said lower base region and extend to said common upper surface, with portions of said gate means overlapping said junctions between said upper and said lower base regions, said upper base region and said cathode region, and said diverter region and said lower base region.

3. A four layer semiconductor switching device comprising in combination;
   a) a semiconductor structure including an anode region, a lower base region, an upper base region, a cathode region, and a diverter region;
   b) an anode electrode affixed to said anode region;
   c) a cathode electrode affixed to said cathode region;
   d) a gate means disposed on and insulated from one surface of said semiconductor structure for modifying the effective resistance of at least one of said base regions thereby reducing the internal feedback of said switching device sufficiently to turn off said semiconductor switching device; wherein
   e) selected portions of said cathode region form a junction with said upper base region and extend to said upper common surface, selected portions of said lower base region form a junction with said upper base region and extend to said upper common surface, with portions of said gate means at least overlying portions of said lower base region which extend to said common upper surface, to selectively couple said upper base region to said diverter region in response to a signal coupled to said gate means.

* * * * *